(12) United States Patent
Shin et al.

(10) Patent No.: US 12,426,462 B2
(45) Date of Patent: Sep. 23, 2025

(54) DISPLAY DEVICE

(71) Applicant: LG Display Co., Ltd., Seoul (KR)

(72) Inventors: SeungHwan Shin, Jeonju-si (KR); YoungMin Jeong, Paju-si (KR); JaeHyung Jo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 470 days.

(21) Appl. No.: 17/973,457

(22) Filed: Oct. 25, 2022

(65) Prior Publication Data

US 2023/0209928 A1    Jun. 29, 2023

(30) Foreign Application Priority Data

Dec. 29, 2021   (KR) .......................... 10-2021-0190754

(51) Int. Cl.
*H10K 59/131* (2023.01)
*H10K 59/12* (2023.01)
*H10K 71/00* (2023.01)

(52) U.S. Cl.
CPC ....... *H10K 59/131* (2023.02); *H10K 59/1201* (2023.02); *H10K 71/861* (2023.02)

(58) Field of Classification Search
CPC ............ H10K 59/131; H10K 59/1201; H10K 71/861; H10K 59/1213; H10K 59/122; H10D 86/441; H10D 86/60; G09F 9/335
See application file for complete search history.

(56) References Cited

U.S. PATENT DOCUMENTS

2018/0151661 A1   5/2018   Oh et al.
2023/0200193 A1*  6/2023   Kang .................. H10K 59/126
                                                           438/4

FOREIGN PATENT DOCUMENTS

KR    1020170081110 A    7/2017
KR    1020180062516 A    6/2018

\* cited by examiner

*Primary Examiner* — Tucker J Wright
(74) *Attorney, Agent, or Firm* — Seed Intellectual Property Law Group LLP

(57) ABSTRACT

According to an aspect of the present disclosure, a display device includes a substrate in which an emission area and a non-emission area are included and having a plurality of sub pixels thereon; at least one gate line disposed in the non-emission area; at least one reference line disposed in the non-emission area and overlapping at least one gate line; and at least one data line disposed in the non-emission area and overlapping at least one gate line, in which the at least one gate line includes a first bridge line and a second bridge line branched at an area overlapping the at least one data line and the at least one reference line and the first bridge line and the second bridge line are disposed on different layers and are connected to each other through a plurality of first contact holes.

14 Claims, 9 Drawing Sheets

DISPLAY DEVICE

CROSS-REFERENCE TO RELATED APPLICATIONS

This application claims the priority of Korean Patent Application No. 10-2021-0190754 filed on Dec. 29, 2021, in the Korean Intellectual Property Office, the disclosure of which is incorporated herein by reference.

BACKGROUND

Technical Field

The present disclosure relates to a display device, and more particularly, to a display device which is capable of implementing a high aperture ratio in a high resolution model.

Description of the Related Art

Currently, as it enters a full-scale information era, a field of a display device which visually expresses electrical information signals has been rapidly developed and studies are continuing to improve performances of various display devices such as thin-thickness, light weight, and low power consumption.

A representative display device may include a liquid crystal display device (LCD), a field emission display device (FED), an electro-wetting display device (EWD), an organic light emitting display device (OLED), and the like.

Among them, the organic light emitting display device is a self-emitting display device so that a separate light source is not necessary, which is different from the liquid crystal display device. Therefore, the organic light emitting display device may be manufactured to have a light weight and a small thickness. Further, since the organic light emitting display device is advantageous not only in terms of power consumption due to the low voltage driving, but also in terms of color implementation, a response speed, a viewing angle, and a contrast ratio (CR), it is expected to be utilized in various fields.

The organic light emitting display device is configured by disposing a light emitting layer which uses an organic material between two electrodes referred to as an anode and a cathode. When holes in the anode are injected into the light emitting layer and electrons in the cathode are injected into the light emitting layer, the injected holes and electrons are recombined and form exciton in the light emitting layer to emit light.

BRIEF SUMMARY

A technical benefit to be achieved by the present disclosure is to provide a display device with an improved aperture ratio by reducing an area in which a color filter is disposed.

Another technical benefit to be achieved by the present disclosure is to provide a display device which maximizes or increases an aperture ratio by a contact hole movement design and increases a lifespan of a light emitting diode.

Still another technical benefit to be achieved by the present disclosure is to provide a display device which is capable of stably performing a repair process while ensuring an aperture ratio by repairing a hole.

Technical benefits of the present disclosure are not limited to the above-mentioned technical benefits, and other technical benefits, which are not mentioned above, can be clearly understood by those skilled in the art from the following descriptions.

In order to achieve the above-described technical benefits, according to an aspect of the present disclosure, a display device includes a substrate including an emission area and a non-emission area and having a plurality of sub pixels thereon; at least one gate line disposed in the non-emission area; at least one reference line disposed in the non-emission area and overlapping at least one gate line; and at least one data line disposed in the non-emission area and overlapping at least one gate line, in which the at least one gate line includes a first bridge line and a second bridge line branched at an area overlapping the at least one data line and the at least one reference line and the first bridge line and the second bridge line are disposed on different layers and are connected to each other through a plurality of first contact holes.

Other detailed matters of the example embodiments are included in the detailed description and the drawings.

According to the present disclosure, a bridge with a gate redundancy structure is formed on different layers and a contact hole configured to connect the bridge is repaired to ensure the higher aperture ratio.

According to the present disclosure, a short defect which may be generated during the repair process may be suppressed while reducing an area of the color filter disposed above the repair pattern.

According to the present disclosure, a position of some contact holes moves to overlap the bank and the contact hole is repaired to reduce the area of the driving circuit and maximize or increase the aperture ratio.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
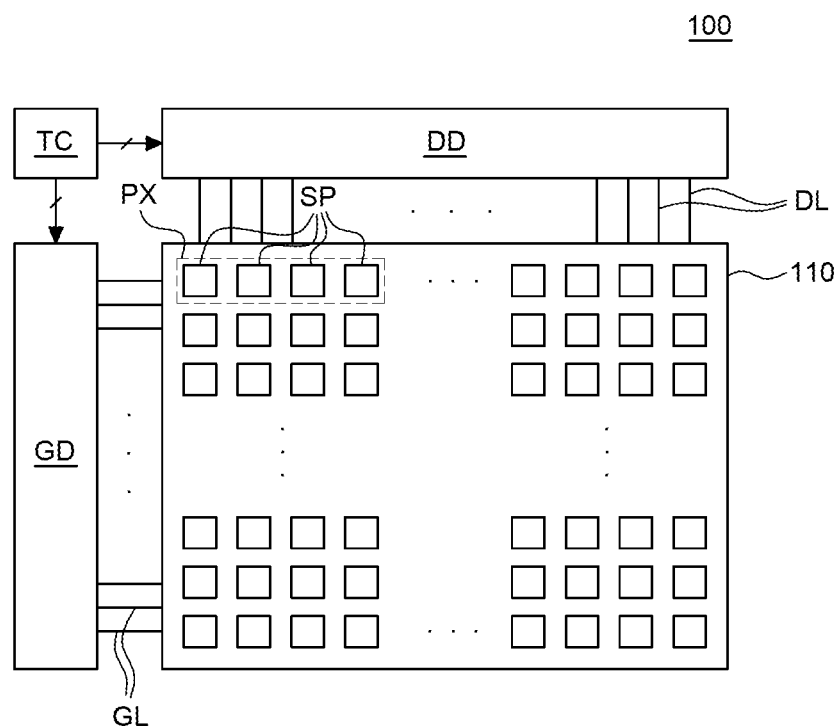
FIG. 1 is a schematic block diagram of a display device according to an example embodiment of the present disclosure.

The advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person with ordinary skill in the art to which the present disclosure pertains with the category of the present disclosure.

The shapes, dimensions, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various embodiments of the present disclosure can be partially or entirely coupled to or combined with each other and can be interlocked and operated in technically various ways, and the embodiments can be carried out independently of or in association with each other.

Hereinafter, various example embodiments of the present disclosure will be described in detail with reference to the accompanying drawings.

A transistor used for a display device of the present disclosure may be implemented by one or more transistors among N-channel transistors (NMOS) and P-channel transistors (PMOS). The transistor may be implemented by an oxide semiconductor transistor having an oxide semiconductor as an active layer or an LTPS transistor having a low temperature poly-silicon (LTPS) as an active layer. The transistor may include at least a gate electrode, a source electrode, and a drain electrode. The transistor may be implemented as a thin film transistor on a display panel. In the transistor, carriers flow from the source electrode to the drain electrode. In the case of the N-channel transistor (NMOS), since the carriers are electrons, in order to allow the electrons to flow from the source electrode to the drain electrode, a source voltage may be lower than a drain voltage. The current in the N-channel transistor (NMOS) flows from the drain electrode to the source electrode and the source electrode may serve as an output terminal. In the case of the P-channel transistor (PMOS), since the carriers are holes, in order to allow the holes to flow from the source electrode to the drain electrode, a source voltage is higher than a drain voltage. In the P-channel transistor (PMOS), the holes flow from the source electrode to the drain electrode so that current flows from the source to the drain, and the drain electrode serves as an output terminal. Accordingly, the source and the drain may be changed in accordance with the applied voltage so that it should be noted that the source and the drain of the transistor are not fixed. In the present specification, it is assumed that the transistor is an N-channel transistor (NMOS), but is not limited thereto so that the P-channel transistor may be used and thus a circuit configuration may be changed.

Gate signals of transistors which are used as switching elements swing between a gate-on voltage and a gate-off voltage. The gate-on voltage is set to be higher than a threshold voltage Vth of the transistor and the gate-off voltage is set to be lower than the threshold voltage Vth of the transistor. The transistor is turned on in response to the gate-on voltage and is turned off in response to the gate-off voltage. In the case of the NMOS, the gate-on voltage is a gate high voltage VGH and the gate-off voltage is a gate low voltage VGL. In the case of the PMOS, the gate-on voltage is a gate low voltage VGL and the gate-off voltage is a gate high voltage VGH.

Hereinafter, various example embodiments of the present disclosure will be described in detail with reference to accompanying drawings.

FIG. 1 is a block diagram schematically illustrating a display device according to an example embodiment of the present disclosure. Referring to FIG. 1, a display device 100 includes a display panel 110, a gate driver GD, a data driver DD, and a timing controller TC.

The display panel 110 is a panel for displaying images. The display panel 110 may include various circuits, wiring lines, and light emitting diodes disposed on the substrate. The display panel 110 includes a plurality of data lines DL and a plurality of gate lines GL that overlap each other and may include a plurality of pixels PX connected to the plurality of data lines DL and the plurality of gate lines GL. The display panel 110 may include a display area having a plurality of pixels PX and a non-display area in which various signal lines or pads are formed. The display panel 110 may be implemented by a display panel 110 used in various display devices such as a liquid crystal display device, an organic light emitting display device, or an electrophoretic display device. Hereinafter, it is described that the display panel 110 is a panel used in the organic light emitting display device, but is not limited thereto.

The timing controller TC receives timing signals such as a vertical synchronization signal, a horizontal synchronization signal, a data enable signal, or a dot clock via a receiving circuit such as an LVDS or TMDS interface connected to a host system. The timing controller TC generates timing control signals based on the input timing signal to control the data driver DD and the gate driver GD.

The data driver DD supplies a data voltage to the plurality of sub pixels SP. The data driver DD may include a plurality of source drive ICs (integrated circuits). The plurality of source drive ICs may be supplied with digital video data and a source timing control signal from the timing controller TC. The plurality of source drive ICs converts digital video data into a gamma voltage in response to the source timing control signal to generate a data voltage and supply the data voltage through the data line DL of the display panel 110. The plurality of source drive ICs may be connected to the data line DL of the display panel 110 by a chip on glass (COG) process or a tape automated bonding (TAB) process. Further, the source drive ICs are formed on the display panel 110 or are formed on a separate PCB substrate to be connected to the display panel 110.

The gate driver GD supplies a gate signal to the plurality of sub pixels SP. The gate driver GD may include a level shifter and a shift register. The level shifter may shift a level of a clock signal input at a transistor-transistor-logic (TTL) level from the timing controller TC and then supply the clock signal to the shift register. The shift register may be formed in the non-display area of the display panel 110, by a GIP manner, but is not limited thereto. The shift register is configured by a plurality of stages which shifts the gate signal to output, in response to the clock signal and the driving signal. The plurality of stages included in the shift register sequentially may output the gate signal through a plurality of output terminals.

The display panel 110 may include a plurality of sub pixels SP. The plurality of sub pixels SP may be sub pixels SP for emitting different color light. For example, the plurality of sub pixels SP may include a red sub pixel, a green sub pixel, a blue sub pixel, and a white sub pixel, but is not limited thereto. The plurality of sub pixels SP may configure a pixel PX. That is, the read sub pixel, the green sub pixel, the blue sub pixel, and the white sub pixel configure one pixel PX and the display panel 110 may include a plurality of pixels PX.

Hereinafter, a driving circuit for driving one sub pixel SP will be described in more detail with reference to FIG. 2 together.

Figure 2:
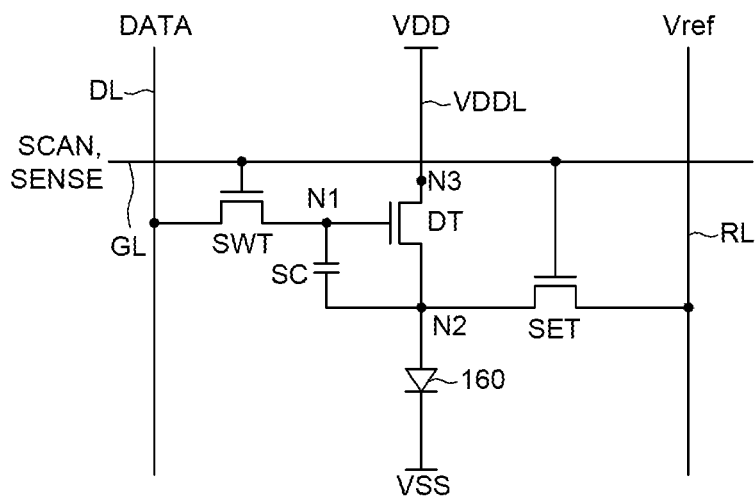
FIG. 2 is a circuit diagram of a sub pixel of a display device according to an example embodiment of the present disclosure.

FIG. 2 is a circuit diagram of a sub pixel of a display device according to an example embodiment of the present disclosure. In FIG. 2, a circuit diagram for one sub pixel SP among the plurality of sub pixels SP of the display device 100 is illustrated.

Referring to FIG. 2, the sub pixel SP may include a switching transistor SWT, a sensing transistor SET, a driving transistor DT, a storage capacitor SC, and a light emitting diode 160.

The light emitting diode 160 may include an anode, an organic layer, and a cathode. The organic layer may include various organic layers such as a hole injection layer, a hole transport layer, an organic light emitting layer, an electron transport layer, and an electron injection layer. The anode of the light emitting diode 160 may be connected to an output terminal of the driving transistor DT and a low potential voltage VSS may be applied to the cathode. Even though in FIG. 2, it is described that the light emitting diode 160 is an organic light emitting diode, the present disclosure is not limited thereto so that as the light emitting diode 160, an inorganic light emitting diode, that is, an LED may also be used.

Referring to FIG. 2, the switching transistor SWT is a transistor which transmits the data voltage DATA to a first node N1 corresponding to a gate electrode of the driving transistor DT. The switching transistor SWT may include a drain electrode connected to the data line DL, a gate electrode connected to the gate line GL, and a source electrode connected to the gate electrode of the driving transistor DT. The switching transistor SWT is turned on by a scan signal SCAN applied from the gate line GL to transmit a data voltage DATA supplied from the data line DL to the first node N1 corresponding to the gate electrode of the driving transistor DT.

Referring to FIG. 2, the driving transistor DT is a transistor which supplies a driving current to the light emitting diode 160 to drive the light emitting diode 160. The driving transistor DT may include a gate electrode corresponding to the first node N1, a source electrode corresponding to a second node N2 and an output terminal, and a drain electrode corresponding to a third node N3 and an input terminal. The gate electrode of the driving transistor DT is connected to the switching transistor SWT, the drain electrode is applied with a high potential voltage VDD via a high potential voltage line VDDL, and the source electrode is connected to the anode of the light emitting diode 160.

Referring to FIG. 2, a storage capacitor SC is a capacitor which maintains a voltage corresponding to the data voltage DATA for one frame. One electrode of the storage capacitor SC may be connected to the first node N1 and the other electrode may be connected to the second node N2.

In the meantime, in the case of the display device 100, as the driving time of each sub pixel SP is increased, the circuit element such as the driving transistor DT may be degraded. Accordingly, a unique characteristic value of the circuit element such as a driving transistor DT may be changed. Here, the unique characteristic value of the circuit element may include a threshold voltage Vth of the driving transistor DT, a mobility $\square$ of the driving transistor DT, or the like. The change in the characteristic value of the circuit element may cause a luminance change of the corresponding sub pixel SP. Accordingly, the change in the characteristic value of the circuit element may be used as the same concept as the luminance change of the sub pixel SP.

Further, the degree of the change in the characteristic values between circuit elements of each sub pixel SP may vary depending on a degree of degradation of each circuit element. Such a difference in the changing degree of the characteristic values between the circuit elements may cause a luminance deviation between the sub pixels SP. Accordingly, the characteristic value deviation between circuit elements may be used as the same concept as the luminance deviation between the sub pixels SP. The change in the characteristic values of the circuit elements, that is, the luminance change of the sub pixel SP and the characteristic value deviation between the circuit elements, that is, the luminance deviation between the sub pixels SP may cause problems such as the lowering of the accuracy for luminance expressiveness of the sub pixel SP or an erroneous screen.

Therefore, the sub pixel SP of the display device 100 according to the example embodiment of the present disclosure may provide a sensing function of sensing a characteristic value for the sub pixel SP and a compensating function of compensating for the characteristic value of the sub pixel SP using the sensing result.

Therefore, as illustrated in FIG. 2, the sub pixel SP may further include a sensing transistor SET to effectively control a voltage state of the source electrode of the driving transistor DT, in addition to the switching transistor SWT, the driving transistor DT, the storage capacitor SC, and the light emitting diode 160.

Referring to FIG. 2, the sensing transistor SET is connected between the source electrode of the driving transistor DT and the reference line RL which supplies a reference voltage Vref and a gate electrode is connected to the gate line GL. Therefore, the sensing transistor SET is turned on by the sensing signal SENSE applied through the gate line GL to apply the reference voltage Vref which is supplied through the reference line RL to the source electrode of the driving transistor DT. Further, the sensing transistor SET may be utilized as one of voltage sensing paths for the source electrode of the driving transistor DT.

Referring to FIG. 2, the switching transistor SWT and the sensing transistor SET of the sub pixel SP may share one gate line GL. That is, the switching transistor SWT and the sensing transistor SET are connected to the same gate line GL to be applied with the same gate signal. However, for the convenience of description, a voltage which is applied to the gate electrode of the switching transistor SWT is referred to as a scan signal SCAN and a voltage which is applied to the gate electrode of the sensing transistor SET is referred to as a sensing signal SENSE. However, the scan signal SCAN and the sensing signal SENSE applied to one sub pixel SP are the same signal which is transmitted from the same gate line GL. Therefore, in FIG. 3, the scan signal SCAN and the sensing signal SENSE are also referred to as gate signals GATE1, GATE2, GATE3, and GATE4.

However, the present disclosure is not limited thereto so that only the switching transistor SWT may be connected to the gate line GL and the sensing transistor SET may be connected to a separate sensing line. Therefore, the scan signal SCAN may be applied to the switching transistor SWT through the gate line GL and the sensing signal SENSE may be applied to the sensing transistor SET through the sensing line.

Accordingly, the reference voltage Vref is applied to the source electrode of the driving transistor DT via the sensing transistor SET. Further, a voltage for sensing the threshold voltage Vth of the driving transistor DT or the mobility □ of the driving transistor DT is detected by the reference line RL. Further, the data driver DD may compensate for the data voltage DATA in accordance with a variation of the threshold voltage Vth of the driving transistor DT or the mobility □ of the driving transistor DT.

Figure 3:
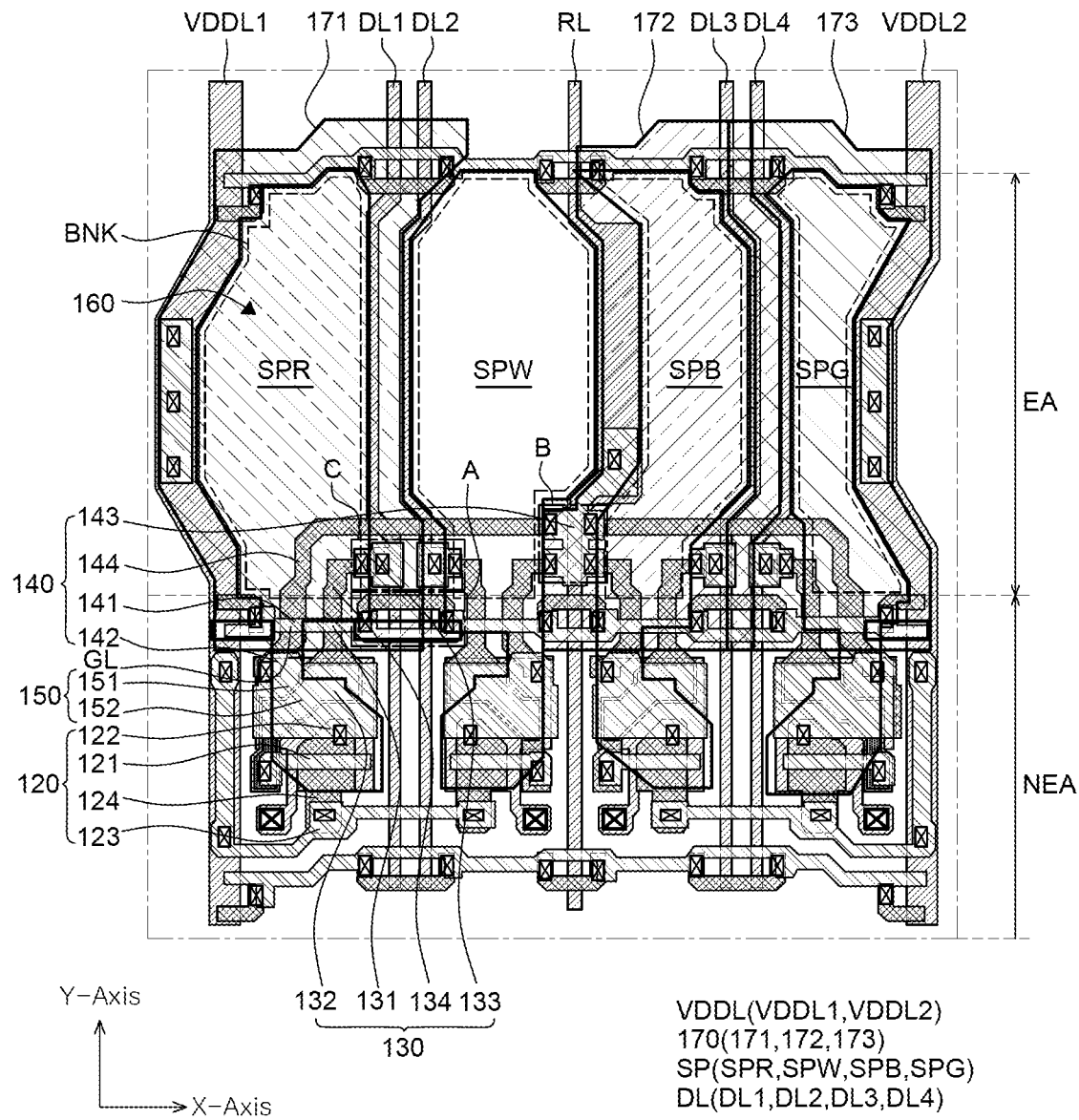
FIG. 3 is an enlarged plan view of a display device according to an example embodiment of the present disclosure.
Figure 4:
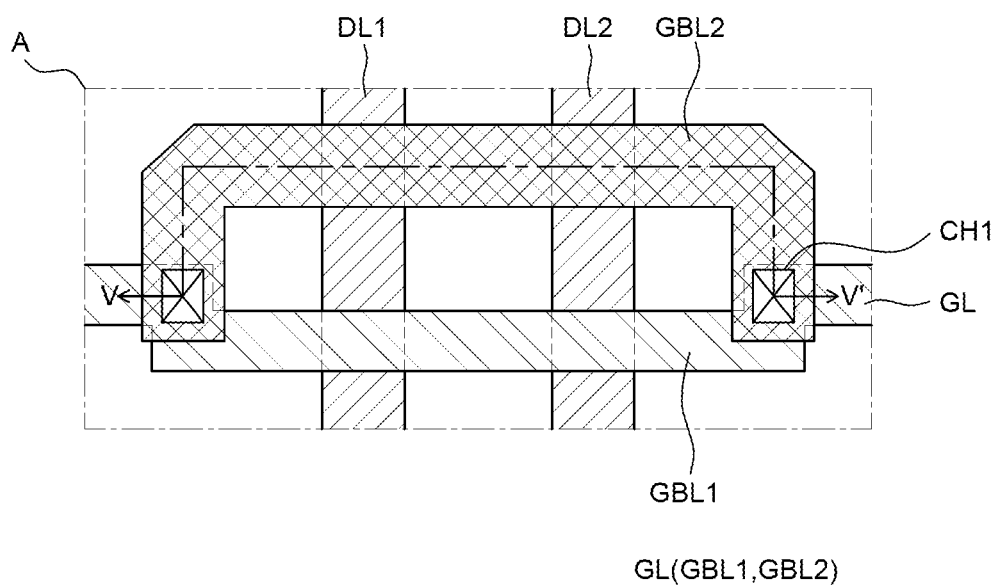
FIG. 4 is an enlarged view of an area A of FIG. 3.
Figure 5:
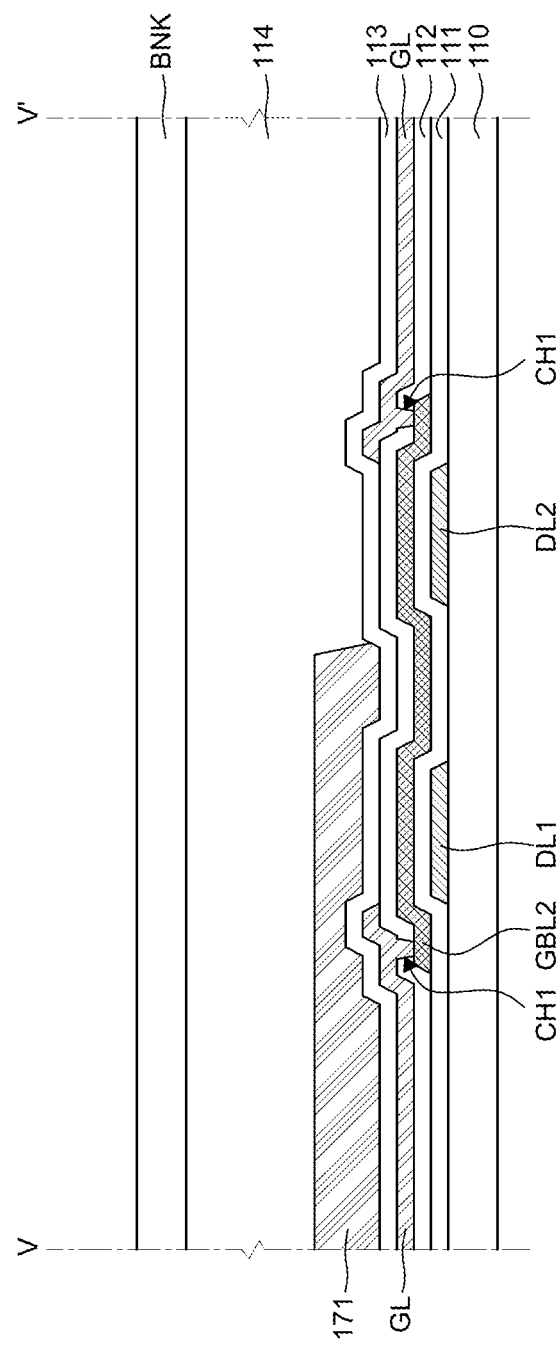
FIG. 5 is a cross-sectional view taken along the line V-V' of FIG. 4.
Figure 6:
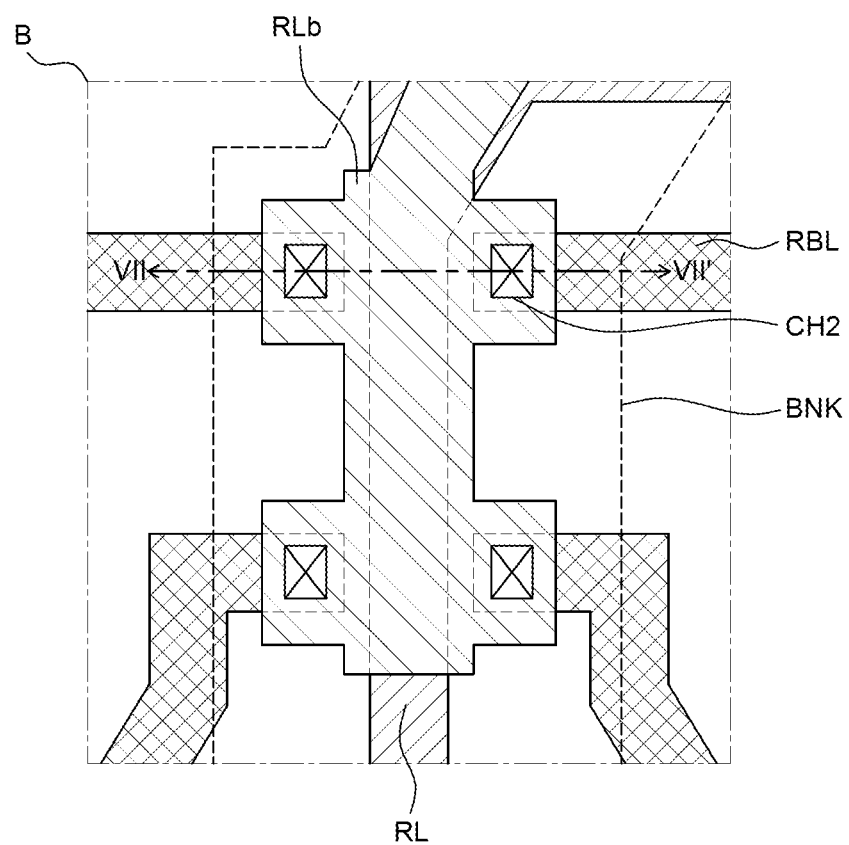
FIG. 6 is an enlarged view of an area B of FIG. 3.
Figure 7:
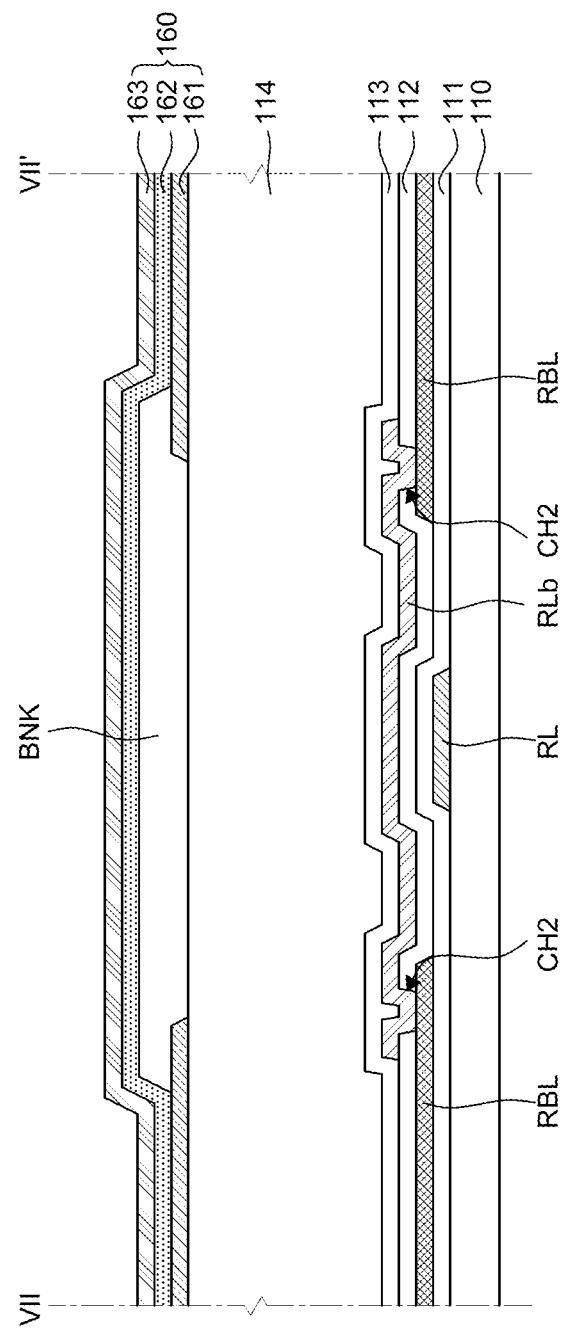
FIG. 7 is a cross-sectional view taken along the line VII-VII' of FIG. 6.
Figure 8:
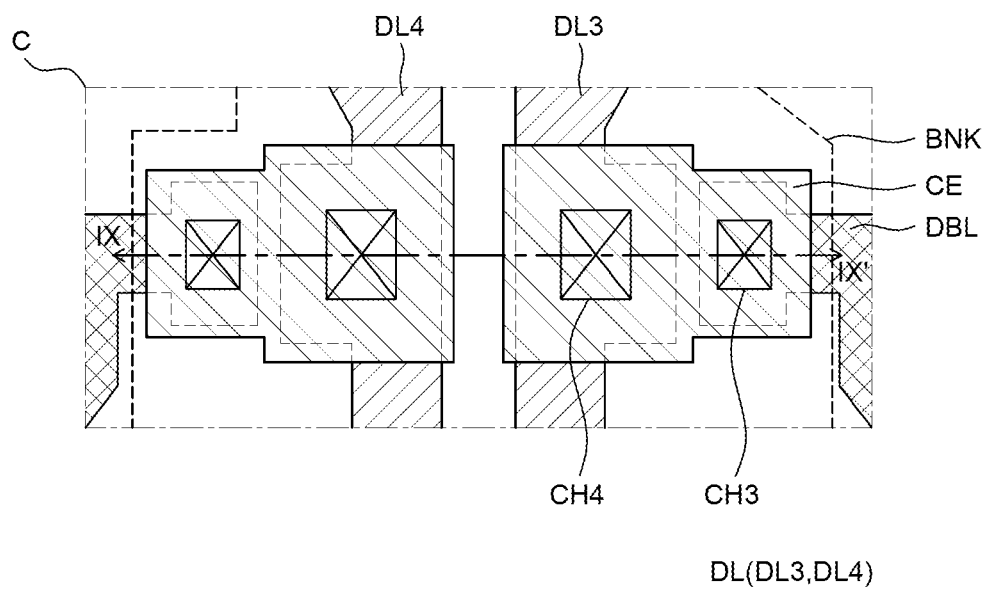
FIG. 8 is an enlarged view of an area C of FIG. 3.
Figure 9:
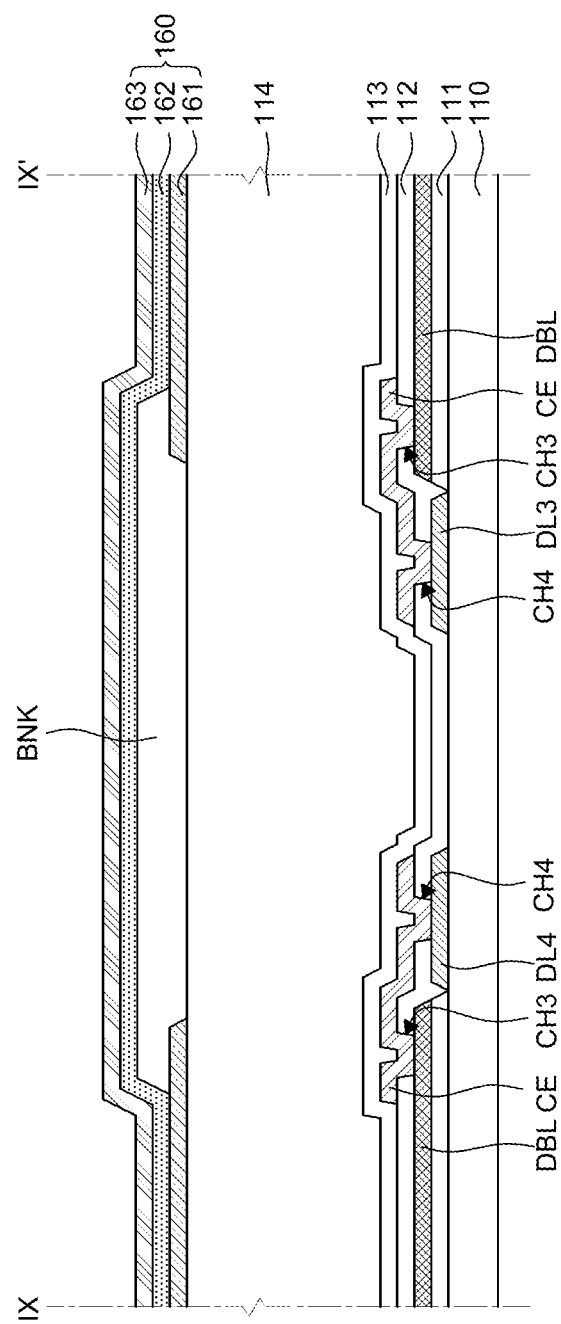
FIG. 9 is a cross-sectional view taken along the line IX-IX' of FIG. 8.

FIG. 3 is an enlarged plan view of a display device according to an example embodiment of the present disclosure. FIG. 4 is an enlarged view of an area A of FIG. 3. FIG. 5 is a cross-sectional view taken along the line V-V' of FIG. 4. FIG. 6 is an enlarged view of an area B of FIG. 3. FIG. 7 is a cross-sectional view taken along the line VII-VII' of FIG. 6. FIG. 8 is an enlarged view of an area C of FIG. 3, and FIG. 9 is a cross-sectional view taken along the line IX-IX' of FIG. 8. For the convenience of illustration, among various components of the display device, in FIG. 4, only a gate line GL and a data line DL are illustrated and in FIG. 5, only components from a substrate 110 to a bank BNK are illustrated.

Referring to FIGS. 3 to 9, a display device 100 according to an example embodiment of the present disclosure includes a substrate 110, a gate line GL, a data line DL, a high potential power line VDDL, a reference line RL, a light emitting diode 160, a first transistor 120, a second transistor 130, a third transistor 140, a storage capacitor 150, a color filter 170, a buffer layer 111, a gate insulating layer 112, a passivation layer 113, and a planarization layer 114. In FIG. 4, for the convenience of illustration, only components to the data line DL and the gate line GL are illustrated.

First, referring to FIG. 3, the plurality of sub pixels SP includes a red sub pixel SPR, a white sub pixel SPW, a blue sub pixel SPB, and a green sub pixel SPG and each sub pixel SP includes an emission area EA and a non-emission area NEA.

The emission area EA is an area where one color light is independently emitted and the light emitting diode 160 may be disposed therein. An emission area EA of the red sub pixel SPR is a red emission area which emits red light, an emission EA of the white sub pixel SPW is a white emission area which emits white light, an emission area of the blue sub pixel SPB is a blue emission area which emits blue light, and an emission area of the green sub pixel SPG is an emission area which emits green light.

The non-emission area NEA is an area in which a driving circuit for driving the plurality of light emitting diodes 160 is disposed and for example, the first transistor 120, the second transistor 130, the third transistor 140, and the storage capacitor 150 are disposed. The non-emission areas of the red sub pixel SPR, the white sub pixel SPW, the blue sub pixel SPB, and the green sub pixel SPG may have similar structures.

Referring to FIG. 3 together, the plurality of high potential power lines VDDL, the plurality of data lines DL, and the reference line RL extending in a column direction (a Y axis direction) are disposed between the plurality of sub pixels SP on the substrate 110. The plurality of high potential power lines VDDL, the plurality of data lines DL, and the reference line RL are disposed on the same layer of the substrate 110 and formed of the same material. For example, the plurality of high potential power lines VDDL, the plurality of data lines DL, and the reference line RL may be configured by a conductive material such as copper (Cu), aluminum (Al), molybdenum (Mo), nickel (Ni), titanium (Ti), chrome (Cr), or an alloy thereof, but are not limited thereto.

The plurality of high potential power lines VDDL is lines which transmit the power signal to each of the plurality of sub pixels SP and includes a first high potential power line VDDL1 and a second high potential power line VDDL2. Two sub pixels SP which are adjacent to each other in a row direction (X-axis direction) may share one high potential power line VDDL among the plurality of high potential power lines VDDL. For example, the first high potential power line VDDL1 is disposed at a left side of the red sub pixel SPR to transmit the power signal to the first transistors 120 of the red sub pixel SPR and the white sub pixel SPW. The second high potential power line VDDL2 is disposed at a right side of the green sub pixel SPG to transmit the power signal to the first transistors 120 of the blue sub pixel SPB and the green sub pixel SPG.

The plurality of data lines DL is lines which transmit a data signal to each of the plurality of sub pixels SP and includes a first data line DL1, a second data line DL2, a third data line DL3, and a fourth data line DL4. The first data line DL1 is disposed between the red sub pixel SPR and the white sub pixel SPW, that is, at a right side of the red sub pixel SPR to transmit the data signal to the second transistor 130 of the red sub pixel SPR. The second data line DL2 is disposed between the first data line DL1 and the white sub pixel SPW, that is, at a left side of the white sub pixel SPW to transmit the data signal to the second transistor 130 of the white sub pixel SPW. The third data line DL3 is disposed between the blue sub pixel SPB and the green sub pixel SPG, that is, at a right side of the blue sub pixel SPB to transmit the data signal to the second transistor 130 of the blue sub pixel SPB. The fourth data line DL4 is disposed between the third data line DL3 and the green sub pixel SPG, that is, at a left side of the green sub pixel SPG to transmit the data signal to the second transistor 130 of the green sub pixel SPG.

The reference line RL transmits a reference signal to each of the plurality of sub pixels SP and may be disposed between the white sub pixel SPW and the blue sub pixel SPB. The plurality of sub pixels SP which forms one pixel may share one reference line RL. The reference line RL may transmit the reference signal to the third transistors 140 of the red sub pixel SPR, the white sub pixel SPW, the blue sub pixel SPB, and the green sub pixel SPG.

The buffer layer 111 may be disposed on the plurality of high potential power lines VDDL, the plurality of data lines DL, and the reference line RL. The buffer layer 111 may reduce permeation of moisture or impurities through the substrate 110. The buffer layer 111 may be configured by a single layer or a double layer of silicon oxide SiOx or silicon nitride SiNx, but is not limited thereto. However, the buffer layer 111 may be omitted depending on a type of substrate 110 or a type of the thin film transistor, but is not limited thereto.

The first transistor 120 is disposed in the non-emission area of each of the red sub pixel SPR, the white sub pixel SPW, the blue sub pixel SPB, and the green sub pixel SPG. The first transistor 120 includes a first gate electrode 121, a first source electrode 122, a first drain electrode 123, and a first active layer 124. The first transistor 120 which is electrically connected to the first electrode 161 of light emitting diode 160 and the high potential power line VDDL may be a driving transistor DT.

First, the first drain electrode 123 may be disposed on the buffer layer 111. The first drain electrode 123 is electrically connected to the plurality of high potential power lines VDDL. Specifically, the first drain electrodes 123 of the red sub pixel SPR and the white sub pixel SPW are electrically connected to the first high potential power line VDDL1 through a contact hole formed in the buffer layer 111. The first drain electrodes 123 of the blue sub pixel SPB and the green sub pixel SPG are electrically connected to the second high potential power line VDDL2 through a contact hole formed in the buffer layer 111.

The first active layer 124 may be disposed on the buffer layer 111. The first active layer 124 may be formed of a semiconductor material such as an oxide semiconductor, amorphous silicon, or polysilicon, but is not limited thereto. For example, when the first active layer 124 is formed of an oxide semiconductor, the first active layer 124 is formed by a channel region, a source region, and a drain region, and the source region and the drain region may be areas on which the material contained in the first active layer 124 becomes conductive, but are not limited thereto.

In the meantime, the first drain electrode 123 of the red sub pixel SPR and the first drain electrode 123 of the white sub pixel SPW may be integrally formed. The first drain electrodes 123 of the blue sub pixel SPB and the green sub pixel SPG may be integrally formed. Specifically, the first drain electrode 123 of the red sub pixel SPR and the first drain electrode 123 of the white sub pixel SPW may be integrally formed to share one first high potential power line VDDL1. For example, the power signal from the first high potential power line VDDL1 may be transmitted to the first drain electrode 123 of the white sub pixel SPW via the first drain electrode 123 of the red sub pixel SPR. The power signal from the second high potential power line VDDL2 may be transmitted to the first drain electrode 123 of the blue sub pixel SPB via the first drain electrode 123 of the green sub pixel SPG. However, the present disclosure is not limited thereto, and the first drain electrode 123 of the red sub pixel SPR and the first drain electrode 123 of the white sub pixel SPW are separately formed. Further, the first drain electrode 123 of the blue sub pixel SPB and the first drain electrode 123 of the green sub pixel SPG may be separately formed.

The first active layer 124 and the first drain electrode 123 of each of the red sub pixel SPR, the white sub pixel SPW, the blue sub pixel SPB, and the green sub pixel SPG may be connected through the contact hole as illustrated in FIG. 3. However, it is not limited thereto so that the first active layer 124 and the first drain electrode 123 may be integrally formed. For example, when a voltage is applied to the first gate electrode 121 of the red sub pixel SPR, the first drain electrode 123 connected to the first active layer 124 through a contact hole may transmit the power signal from the first high potential power line VDDL1 to the first active layer 124 and the first source electrode 122. However, the first drain electrode 123 may be integrally formed with the first high potential power line VDDL1, but is not limited thereto.

The gate insulating layer 112 is disposed on the first active layer 124. The gate insulating layer 112 may be a layer which insulates the first gate electrode 121 from the first active layer 124. The gate insulating layer 112 may be disposed only in an area corresponding to the first gate electrode 121 and conductive layers which are formed of the same material as the first gate electrode 121 by the same process. For example, the gate insulating layer 112 may be disposed on the entire surface of the substrate 110 and then removed together when the first gate electrode 121 and the conductive layers disposed on the gate insulating layer 112 are patterned. For example, the gate insulating layer 112 may be configured by a single layer or a double layer of an insulating material such as silicon oxide SiOx or silicon nitride SiNx, but is not limited thereto.

The first gate electrode 121 may be disposed on the gate insulating layer 112 so as to overlap the active layer 124 in each of the red sub pixel SPR, white sub pixel SPW, the blue sub pixel SPB, and the green sub pixel SPG. The first gate electrode 121 may be configured by a conductive material, such as copper (Cu), aluminum (Al), molybdenum (Mo), nickel (Ni), titanium (Ti), chrome (Cr), or an alloy thereof, but is not limited thereto.

The first source electrode 122 which is spaced apart from the first gate electrode 121 is disposed on the gate insulating layer 112 in each of the red sub pixel SPR, the blue sub pixel SPB, and the green sub pixel SPG. The first source electrode 122 may be electrically connected to the first active layer 124 through a contact hole formed in the gate insulating layer 112. The first source electrode 122 is disposed on the same layer as the first gate electrode 121 to be formed of the same material, but is not limited thereto. The first source electrode 122 may be configured by a conductive material such as copper (Cu), aluminum (Al), molybdenum (Mo), nickel (Ni), titanium (Ti), chrome (Cr), or an alloy thereof, but is not limited thereto.

The second transistor 130 is disposed in the non-emission area NEA of each of the plurality of sub pixels SP. The second transistor 130 includes a second gate electrode 131, a second source electrode 132, a second drain electrode 133, and a second active layer 134. The second transistor 130 which is electrically connected to the gate line GL, the data line DL, and the first gate electrode 121 of the first transistor 120 may be a switching transistor SWT.

First, in each of the plurality of sub pixels SP, the second drain electrode 133 may be disposed between the substrate 110 and the buffer layer 111. The second drain electrode 133 is electrically connected to one data line DL among the plurality of data lines DL. The second drain electrode 133 is formed as a connection electrode CE connected to the plurality of data lines DL through a contact hole to be disposed on the same layer as the first drain electrode 123 and formed of the same material. For example, the second drain electrode 133 may be configured by a conductive material such as copper (Cu), aluminum (Al), molybdenum (Mo), nickel (Ni), titanium (Ti), chrome (Cr), or an alloy thereof, but is not limited thereto.

The second source electrode 132 is disposed in each of the plurality of sub pixels SP. The second source electrode 132 may be the same node as the gate electrode 121 of the first transistor 120. The second source electrode 132 may be an auxiliary metal layer to be described below, or the same layer as the gate electrode 121, or the same layer as the plurality of high potential power lines VDDL.

The second active layer 134 may be disposed on the buffer layer 111 in each of the plurality of sub pixels SP. The second active layer 134 may be electrically connected to the second source electrode 132 and the second drain electrode 133. The second active layer 134 may be formed of a semiconductor material such as an oxide semiconductor, amorphous silicon, or polysilicon, but is not limited thereto. In the meantime, an auxiliary metal layer may be further disposed in a partial area on the second active layer 134 to form a conductor. At this time, the auxiliary metal layer may be configured by an opaque metal layer such as molytitanium (MoTi).

In each of the plurality of sub pixels SP, the second gate electrode 131 may be disposed on the gate insulating layer 112 so as to overlap the second active layer 134. The second gate electrode 131 may be configured by a conductive material such as copper (Cu), aluminum (Al), molybdenum (Mo), nickel (Ni), titanium (Ti), chrome (Cr), or an alloy thereof, but is not limited thereto.

The second gate electrode 131 may be the gate line GL. That is, a part of the gate line GL may serve as the second gate electrode 131. The gate line GL may be configured by a conductive material such as copper (Cu), aluminum (Al), molybdenum (Mo), nickel (Ni), titanium (Ti), chrome (Cr), or an alloy thereof, but is not limited thereto.

The gate line GL transmits a gate signal to each of the plurality of sub pixels SP and extends in a row direction to traverse the plurality of sub pixels SP. For example, the gate line GL extends between the non-emission area NEA and the emission area EA of each of the plurality of sub pixels SP in the row direction to overlap the plurality of high potential power lines VDDL, the plurality of data lines DL, and the reference line RL extending in the column direction. A gate redundancy structure formed in the gate line GL will be described in detail below with reference to FIGS. 4 and 5.

The third transistor 140 is disposed in the non-emission area NEA of each of the plurality of sub pixels SP. The third transistor 140 includes a third gate electrode 141, a third source electrode 142, a third drain electrode 143, and a third active layer 144. The third transistor 140 which is electrically connected to the reference line RL, the gate line GL, and the second capacitor electrode 152 of the storage capacitor 150 may be a sensing transistor SET.

First, in each of the plurality of sub pixels SP, the third source electrode 142 may be disposed between the substrate 110 and the buffer layer 111. The third source electrode 142 is disposed on the same layer as the plurality of high potential power lines VDDL, the plurality of data lines DL, and the reference line RL and is formed of the same material. The third source electrode 142 may be configured by a conductive material such as copper (Cu), aluminum (Al), molybdenum (Mo), nickel (Ni), titanium (Ti), chrome (Cr), or an alloy thereof, but is not limited thereto.

Further, the third source electrode 142 may be electrically connected to the second capacitor electrode 152 which forms the storage capacitor 150, which will be described below.

In the meantime, the third source electrode 142 may serve as a light shielding layer which blocks light incident onto the first active layer 124 of the first transistor 120. For example, when light is irradiated onto the first active layer 124, a leakage current is generated so that the reliability of the first transistor 120 may be degraded. In this case, the third source electrode 142 which is formed of a conductive material which is not transparent is disposed below the first active layer 124 and the first gate electrode 121 to block light which is incident onto the first active layer 124 from the lower portion of the substrate 110. Therefore, the reliability of the first transistor 121 may be improved.

The third active layer 144 may be disposed on the buffer layer 111 in each of the plurality of sub pixels SP. The third active layer 144 is electrically connected to the third source electrode 142 through a contact hole formed in the buffer layer 111 and may be electrically connected to the third drain electrode 143 through a contact hole formed in the gate insulating layer 112. At this time, the third active layer 144 is connected to the third drain electrode 143 connected to the reference line RL through a contact hole to extend from the reference line RL in a row direction so that the third active layer may be referred to as a reference branch line RBL. The third active layer 144 may be formed of a semiconductor material such as an oxide semiconductor, amorphous silicon, or polysilicon, but is not limited thereto.

In each of the plurality of sub pixels SP, the third gate electrode 141 is disposed on the gate insulating layer 112 so as to overlap the third active layer 144. The third gate electrode 141 may be the gate line GL. That is, a part of the gate line GL may serve as the third gate electrode 141. The third gate electrode 141 may be configured by a conductive material such as copper (Cu), aluminum (Al), molybdenum (Mo), nickel (Ni), titanium (Ti), chrome (Cr), or an alloy thereof, but is not limited thereto.

The third drain electrode 143 is disposed on the gate insulating layer 112 in each of the plurality of sub pixels SP. The third drain electrode 143 may be electrically connected to the third active layer 144 through a contact hole formed in the gate insulating layer 112. The third drain electrode 143 may be configured by a conductive material such as copper (Cu), aluminum (Al), molybdenum (Mo), nickel (Ni), titanium (Ti), chrome (Cr), or an alloy thereof, but is not limited thereto.

The third drain electrode 143 is electrically connected to the reference line RL. The third drain electrode 143 is integrally formed with the reference line RL to be formed of the same material as the reference line RL. Alternatively, the third drain electrode 143 is formed of a gate metal layer connected to the reference line RL through a contact hole to be disposed on the same layer as the first drain electrode 123 and formed of the same material. Therefore, the third drain electrode 143 may be configured by a conductive material such as copper (Cu), aluminum (Al), molybdenum (Mo), nickel (Ni), titanium (Ti), chrome (Cr), or an alloy thereof, but is not limited thereto.

The storage capacitor 150 is disposed in the non-emission area of each of the red sub pixel SPR, the white sub pixel SPW, the blue sub pixel SPB, and the green sub pixel SPG. The storage capacitor 150 may store a voltage between the first gate electrode 121 and the first source electrode 122 of the first transistor 120 to allow the light emitting diode 160 to continuously maintain a constant state for one frame. The storage capacitor 150 includes a first capacitor electrode 151 and a second capacitor electrode 152.

In each of the red sub pixel SPR, the blue sub pixel SPB, and the green sub pixel SPG, the first capacitor electrode 151 is disposed between the substrate 110 and the buffer layer 111. The first capacitor electrode 151 may be disposed to be the closest to the substrate 110 among the conductive components disposed on the substrate 110. Accordingly, a distance between the first capacitor electrode 151 and the second electrode 163 is increased so that a parasitic capacitance which may be generated between the first capacitor electrode 151 and the second electrode 163 may be minimized or reduced.

The first capacitor electrode 151 may be integrally formed with the second source electrode 132 to be electrically connected to the second source electrode 132. The first capacitor electrode 151 may be electrically connected to the first gate electrode 121 through a contact hole formed in the buffer layer 111. That is, the second source electrode 132 of the second transistor 130 and the first gate electrode 121 of the first transistor 120 may be electrically connected to each other through the first capacitor electrode 151. The first capacitor electrode 151 which is integrally formed with the second source electrode 132 may be formed of the same material as the second source electrode 132. For example, the first capacitor electrode 151 may be configured by a conductive material such as copper (Cu), aluminum (Al), molybdenum (Mo), nickel (Ni), titanium (Ti), chrome (Cr), or an alloy thereof, but it is not limited thereto.

In this case, the first capacitor electrode 151 is disposed below the first gate electrode 121 and the first source electrode 122. The first capacitor electrode 151 overlaps the first source electrode 122.

In each of the red sub pixel SPR, the blue sub pixel SPB, and the green sub pixel SPG, the second capacitor electrode 152 is disposed on the gate insulating layer 112. The second capacitor electrode 152 may be formed on the first capacitor electrode 151 so as to overlap the first capacitor electrode 151. In this case, two insulating layers, that is, the buffer layer 111 and the gate insulating layer 112 may be disposed between the second capacitor electrode 152 and the first capacitor electrode 151.

The second capacitor electrode 152 may suppress the light leakage in the non-emission area NEA of the red sub pixel SPR, the white sub pixel SPW, the blue sub pixel SPB, and the green sub pixel SPG. Specifically, in the emission areas EA of the red sub pixel SPR, the blue sub pixel SPB, and the green sub pixel SPG, color filters 170 corresponding to the corresponding pixel are disposed to convert white light emitted from the light emitting diode 160 into red light, blue light, or green light. When unintended light is emitted from the non-emission area NEA of the red sub pixel SPR, the blue sub pixel SPB, and the green sub pixel SPG, light emitted from the emission area EA and light of non-emission area NEA are mixed so that a color coordinate of each sub pixel SP may be distorted. In this case, the second capacitor electrode 152 may be formed of a conductive material which is not transparent to be disposed below the light emitting diode 160. Accordingly, even though unintended light is emitted from the circuit units of the red sub pixel SPR, the blue sub pixel SPB, and the green sub pixel SPG, the light emitted from the circuit units may be suppressed from passing though the substrate 110 by the second capacitor electrode 152. Therefore, the light leakage in the circuit is suppressed and a color purity in each sub pixel SP may be improved.

The second capacitor electrode 152 may be integrally formed with the first source electrode 122 to be electrically connected to the first source electrode 122. A part of the first source electrode 122 which overlaps the first capacitor electrode 151 may also be referred to as a second capacitor electrode 152. The second capacitor electrode 152 which is integrally formed with the first source electrode 122 is formed of the same material as the first source electrode 122. For example, the second capacitor electrode 152 may be configured by a conductive material such as copper (Cu), aluminum (Al), molybdenum (Mo), nickel (Ni), titanium (Ti), chrome (Cr), or an alloy thereof, but it is not limited thereto.

In summary, the first capacitor electrode 151 of the storage capacitor 150 is integrally formed with the second source electrode 132 to be electrically connected to the first gate electrode 121 of the first transistor 120 and the second source electrode 132 of the second transistor 130. The second capacitor electrode 152 is integrally formed with the first source electrode 122 to be electrically connected to the first source electrode 122 of the first transistor 120 and the third source electrode 142 of the third transistor 140.

Next, the passivation layer 113 may be disposed on the first transistor 120, the second transistor 130, the third transistor 140, the storage capacitor 150, the plurality of high potential power lines VDDL, the plurality of data lines DL, the reference line RL, and the gate line GL. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on the example embodiment.

A plurality of color filters 170 is disposed on the passivation layer 113. Specifically, the plurality of color filters 170 may be disposed between the planarization layer 114 and the passivation layer 113. The plurality of color filters 170 includes a first color filter 171, a second color filter 172, and a third color filter 173. For example, the first color filter 171 is a red color filter, the second color filter 172 is a blue color filter, and the third color filter 173 is a green color filter.

The first color filter 171 may be disposed between the substrate 110 and the planarization layer 114 in the emission area EA of one sub pixel SP among the plurality of sub pixels SP. The first color filter 171 may be disposed between the first transistor 120 and the planarization layer 114 in the non-emission area NEA of one sub pixel SP among the plurality of sub pixels SP. For example, the first color filter 171 may be a red color filter. The first color filter 171 is disposed between the substrate 110 and the planarization layer 114 in the emission area EA of the red sub pixel SPR and disposed between the planarization layer 114 and the second transistor 130 and the third transistor 140 in the non-emission area NEA of the red sub pixel SPR. Specifically, the first color filter 171 may go beyond the emission area EA to extend to a partial area of the non-emission area NEA in which the gate line GL is disposed.

The second color filter 172 may be disposed between the substrate 110 and the planarization layer 114 in the emission area EA of the other sub pixel SP among the plurality of sub pixels SP. The second color filter 172 is disposed between the first transistor 120 and the planarization layer 114 in the non-emission area NEA of the other sub pixel SP among the plurality of sub pixels SP and is disposed between the first color filter 171 and the planarization layer 114 in the non-emission area NEA of one sub pixel SP. For example, the second color filter 172 is a blue color filter. The second color filter 172 is disposed between the substrate 110 and the planarization layer 114 in the emission area EA of the blue sub pixel SPB and is disposed between the planarization layer 114 and the second transistor 130 and the third transistor 140 in the non-emission area NEA of the blue sub pixel SPB. Further, the second color filter 172 may be disposed between the first color filter 171 and the planarization layer 114 in the non-emission area NEA of the red sub pixel SPR. Specifically, the second color filter 172 may go beyond the emission area EA to extend to a partial area of the non-emission area NEA in which the gate line GL is disposed.

Specifically, the second color filter 172 may be disposed between the substrate 110 and the planarization layer 114 in each non-emission area NEA of each of the red sub pixel SPR, the white sub pixel SPW, and the green sub pixel SPG in addition to the non-emission area NEA of the blue sub pixel SPB.

Specifically, the second color filter 172 may also be disposed above the gate line GL including a gate redundancy structure for gate repair. That is, the second color filter 172 may be disposed to overlap the gate line GL. This is because a damage which may be caused in the second electrode 163 during a laser processing process for gate repair may be blocked by the second color filter 172. The second color filter 172 and the first color filter 171 may absorb the laser in a wavelength band used for the repair process so that the laser cannot reach the light emitting diode 160 or is heavily attenuated before reaching the light emitting diode 160. Therefore, the short defect which may be caused in the light emitting diode 160 may be suppressed. In contrast, the third color filter 173 transmits laser in the specific wavelength band of the repair process as it is to cause a defect in the light emitting diode 160. Further, the first color filter 171 is likely to cause a Hume during the laser process for repair so that the second color filter 172 may be disposed above the gate line (GL) repair region to suppress the repair damage.

Further, the first color filter 171 and the second color filter 172 disposed in the non-emission area NEA of each of the plurality of sub pixels SP may partially overlap. In the non-emission area NEA of each of the plurality of sub pixels SP, the first color filter 171 may be disposed between the substrate 110 and the planarization layer 114 and the second color filter 172 may be disposed between the first color filter 171 and the planarization layer 114. Therefore, the first color filter 171 and the second color filter 172 may overlap in the non-emission area NEA of each of the plurality of sub pixels SP. Specifically, referring to FIGS. 3 to 5, in a first bridge line GBL1 region of the gate line GL, the first color filter 171 and the second color filter 172 may overlap each other to suppress the damage during the repair process.

The third color filter 173 is disposed in the emission area EA of the other sub pixel SP among the plurality of sub pixels SP. For example, the third color filter 173 is a green color filter and is disposed between the substrate 110 and the planarization layer 114 in the emission area EA of the green sub pixel SPG and is disposed between the planarization layer 114 and the second transistor 130 and the third transistor 140 in the non-emission area NEA of the green sub pixel SPG. Specifically, the third color filter 173 may go beyond the emission area EA to extend to a partial area of the non-emission area NEA in which the gate line GL is disposed. The third color filter 173 may overlap the second color filter 172 in a partial area of the non-emission area NEA of each of the plurality of sub pixels SP. Specifically, referring to FIG. 3, in a first bridge line GBL1 region of the gate line GL, the second color filter 172 and the third color filter 173 may overlap each other to suppress the damage during the repair process.

In the meantime, the color filter 170 is not disposed in the emission area EA of the white sub pixel SPW, but is disposed only in the non-emission NEA. Specifically, the light emitting diode 160 emits white light so that a color filter for converting light emitted from the light emitting diode 160 is not included for the white sub pixel SPW. Therefore, a separate color filter may not be disposed in the emission area EA of the white sub pixel SPW.

The planarization layer 114 may be disposed on the passivation layer 113 and the color filters 171 and 172. The planarization layer 114 is an insulating layer which planarizes an upper portion of the substrate 110 on which the first transistor 120, the second transistor 130, the third transistor 140, the storage capacitor 150, the plurality of high potential power lines VDDL, the plurality of data lines DL, the reference line RL, and the gate line GL are disposed. The planarization layer 114 may be formed of an organic material, and for example, may be configured by a single layer or a double layer of polyimide or photo acryl, but is not limited thereto.

The light emitting diode 160 is disposed in each of the plurality of sub pixels SP. The light emitting diode 160 is disposed on the planarization layer 114 in each of the plurality of sub pixels SP. The light emitting diode 160 includes a first electrode 161, a light emitting layer 162, and a second electrode 163.

The first electrode 161 is disposed on the planarization layer 114 in the emission area EA. The first electrode 161 supplies holes to the light emitting layer 162 so that the first electrode 161 may be formed of a conductive material having a high work function and may be referred to as an anode. For example, the first electrode 161 may be formed of a transparent conductive material such as indium tin oxide (ITO) and indium zinc oxide (IZO), but is not limited thereto.

In the meantime, when the display device 100 according to the example embodiment of the present disclosure is a top emission type, a reflective layer which is formed of metal material having an excellent reflection efficiency, such as aluminum (Al) or silver (Ag) may be added below the first electrode 161. Therefore, the light emitted from the light emitting layer 162 is reflected to the first electrode 161 to be upwardly directed, that is, to be directed to the second electrode 163. In contrast, when the display device 100 is a bottom emission type, the first electrode 161 may be only formed of a transparent conductive material. Hereinafter, the description will be made under the assumption that the display device 100 according to the example embodiment of the present disclosure is a bottom emission type.

In the emission area EA and the non-emission area NEA, the light emitting layer 162 is disposed on the first electrode 161. The light emitting layer 162 may be formed as one layer over the plurality of sub pixels SP. That is, the light emitting layers 162 of the plurality of sub pixels SP are connected to each other to be integrally formed. The light emitting layer 162 may be configured as one light emitting layer 162 or may have a structure in which a plurality of light emitting layers 162 emitting different color light is laminated. The light emitting layer 162 may further include an organic layer such as a hole injection layer, a hole transport layer, an electron transport layer, and an electron injection layer.

In the emission area EA and the non-emission area NEA, the second electrode 163 is disposed on the light emitting layer 162. The second electrode 163 supplies electrons to the light emitting layer 162 so that the second electrode may be formed of a conductive material having a low work function and may be referred to as a cathode. The second electrode 163 may be formed as one layer over the plurality of sub pixels SP. That is, the second electrodes 163 of the plurality of sub pixels SP are connected to each other to be integrally formed. For example, the second electrode 163 may be formed of a transparent conductive material such as indium tin oxide ITO and indium zinc oxide IZO or ytterbium (Yb) alloy and may further include a metal doping layer, but is not limited thereto. Even though not illustrated in FIGS. 3 to 5, the second electrode 163 of the light emitting diode 160 may be electrically connected to the low potential power line to be supplied with a low potential power signal.

The light emitting diode 160 includes an extension portion extending from the first electrode 161 to the non-emission area NEA. The extension portion extends from the first electrode 161 of the emission area EA to the first source electrode 122 of the non-emission area NEA to be electrically connected to the first source electrode 122 through contact holes formed in the planarization layer 114 and the passivation layer 113. Accordingly, the first electrode 161 of the light emitting diode 160 may be electrically connected to the first source electrode 122 of the first transistor 120 and the second capacitor electrode 152 of the storage capacitor 150 through the extension portion.

Next, the gate line GL will be described with reference to FIGS. 4 and 5. The gate line GL is a wiring line which transmits a gate signal to each of the plurality of sub pixels SP and extends in a row direction to traverse the plurality of sub pixels SP. The gate line GL is sequentially supplied with a scan signal according to the control of the timing controller so that the gate line GL may be referred to as a scan line. As illustrated in FIG. 3, even though in the present disclosure, one scan line structure in which the second transistor 130 and the third transistor 140 operate for one gate line GL will be mainly described, two scan lines having two gate lines GL may also be applied in the same way.

Specifically, the gate line GL may use a gate redundancy structure in an area which overlaps vertical signal lines such as a plurality of data lines DL. The gate redundancy structure is a structure in which the gate line GL is branched into two lines only in an area in which the gate line GL and the plurality of signal lines overlap. The gate redundancy structure includes a first bridge line GBL1 which extends along the gate line GL and then is downwardly branched with respect to the Y-axis direction and a second bridge line GBL2 which is upwardly branched.

The first bridge line GBL1 of the gate line GL may be formed of a first layer. Here, the first layer may be a metal layer which configures a gate electrode of at least one transistor of the non-emission area. That is, the first bridge line GBL1 may be formed of the same material as the gate line GL of the related art. The gate line GL and the first bridge line GBL1 may be configured by a conductive material such as copper (Cu), aluminum (Al), molybdenum (Mo), nickel (Ni), titanium (Ti), chrome (Cr), or an alloy thereof, but is not limited thereto.

In the meantime, the second bridge line GBL2 of the gate line GL may be disposed on a different layer from that of the first bridge line GBL1. The second bridge line GBL2 may be connected to the first bridge line GBL1 through a plurality of first contact holes CH1. The second bridge line GBL2 may be configured by a second layer disposed below the first layer. Here, the second layer may include at least one of a semiconductor layer of the transistor of the non-emission area and an auxiliary metal layer. Further, the second bridge line GBL2 configured by the second layer may have a multilayered structure in which the semiconductor layer and the auxiliary metal layer of the transistor of the non-emission area are laminated. That is, the second bridge line GBL2 of the gate line GL may be disposed on the same layer as the second active layer 134 and be formed of the same material. The semiconductor layer of the second bridge line GBL2 may be formed of a semiconductor material such as an oxide semiconductor, amorphous silicon, or polysilicon, but is not limited thereto. The auxiliary metal layer of the second bridge line GBL2 may be configured by an opaque metal layer such as molytitanium (MoTi). However, it is not limited thereto and the second bridge line GBL2 of the gate line GL is formed on the same layer as the gate line GL and the first bridge line GBL1 may be formed on the same layer as the second active layer 134.

In the meantime, even though the area between the red sub pixel SPR and the white sub pixel SPW has been described with reference to FIGS. 4 and 5, a structure between the red sub pixel SPR and the white sub pixel SPW illustrated in FIGS. 4 and 5 may be applied to an area between the white sub pixel SPW and the blue sub pixel SPB, an area between the blue sub pixel SPB and the green sub pixel SPG, and an area between the green sub pixel SPG and the red sub pixel SPR in the same way.

As described above, in the display device 100 according to the example embodiment of the present disclosure, in the gate redundancy structure of the gate line GL, the first bridge line GBL1 may be formed of the same material as the gate line GL. Further, the second bridge line GBL2 may be formed by the semiconductor layer and the auxiliary metal line as the same as the second active layer 134. Accordingly, the display device 100 according to the example embodiment of the present disclosure may suppress the damage which may be caused during the laser process while improving the aperture ratio.

In the related art, the gate line has used a gate redundancy structure to suppress the damage of the wiring line or the electrode caused in the area overlapping the plurality of data lines, by the laser during the repair process and add an easiness of the repair process. The gate redundancy structure branches the gate line into two lines only in an area in which the gate line and the plurality of data lines overlap. At this time, when a short is caused between heterogeneous metal layers in an overlapping area between heterogeneous lines, a short problem may be solved by removing one of branched lines of the gate line. Specifically, when the short is generated between an upper bridge line of the gate line and the data line, if both side areas of the data line of the upper bridge line are removed by the laser, the problem caused by the short may be solved.

However, when the laser process is performed for the gate repair, the laser may pass through the gate metal layer to reach a portion where the light emitting diode 160 is laminated. When the laser reaches the light emitting diode 160, the short defect may be caused between the first electrode 161 and the second electrode 163 of the light emitting diode 160, which causes the defect of the light emitting diode 160. In order to suppress this problem, in the related art, a repair protection layer has been disposed above the gate line in which the gate repair is performed. Here, the repair protection layer may be a blue color filter which is configured by a pigment absorbing a blue wavelength band. This is because the blue color filter and the red color filter may absorb a laser having a specific wavelength band in the repair process, but the green color filter may transmit the laser having the specific wavelength band as it is. Further, in the red color filter, it is highly likely to generate Hume during the laser process for repair so that the blue color filter has been disposed above the gate line as a repair protection layer.

However, as the high resolution model progressed, the gate line and wiring lines for driving the pixels were disposed to be adjacent to the opening, that is, the emission area. Accordingly, there is a problem in that it is difficult to dispose the repair protection layer above the gate line of the related art. When the repair protection layer is disposed in the emission area, the transmittance is degraded, which causes a luminance variation in the emission area and reduces the lifespan of the light emitting diode 160.

Accordingly, in the display device 100 according to the example embodiment of the present disclosure, the second bridge line GBL2 is formed on the same layer and formed of the same material as the second active layer 134 and the first bridge line GBL1 and the plurality of first contact holes CH1 are formed to be connected to the gate line GL. Accordingly, in the display device 100 of the present disclosure, the plurality of first contact holes CH1 configured to connect the first bridge line GBL1 and the second bridge line GBL2 is subjected to the laser process to perform the repair process. This is referred to as a hole repair.

Specifically, when the short defect is generated in the first bridge line GBL1, a laser in the specific wavelength band which removes the gate line GL is irradiated onto the first bridge line GBL1 to perform the repair process. In contrast, when the short defect is generated in the second bridge line GBL2, the second layer which configures the second bridge line GBL2 is disposed below the first layer which configures the first bridge line GBL1. Therefore, a laser in the specific wavelength band which removes only to the second layer is irradiated to the plurality of first contact holes CH1 to perform the repair process.

That is, the second bridge line GBL2 is formed by the second layer so that the repair process may be performed via the plurality of first contact holes CH1 so that the repair protection layer does not need to be disposed above the second bridge line GBL2. Accordingly, the repair protection layer may be disposed only above the first bridge line GBL1. As a result, the area in which the repair protection layer is disposed is far from the emission area EA so that the aperture ratio may be improved.

Further, in the related art, in order to perform the gate repair process, the laser is irradiated in the gate bridge area so that it is difficult to ensure a margin which does not affect adjacent other wiring lines or openings. In contrast, in the display device 100 according to the example embodiment of the present disclosure, the gate repair process is performed while irradiating laser onto the plurality of first contact holes CH1 so that the margin for the area in which the repair is performed may be increased more than the existing repair method. That is, the hole repair process is performed to stably perform the repair process while ensuring the aperture ratio of the display device 100.

Further, the second layer may include at least one of a semiconductor layer of the transistor of the non-emission area and an auxiliary metal layer. That is, the semiconductor layer of the second layer may be formed of a semiconductor material such as oxide semiconductor, amorphous silicon, or polysilicon. When the semiconductor material is disposed in the second bridge line GBL2 of the gate line GL, since the semiconductor material has a transmittance which is much higher than that of the metal material, much more margins may be ensured in the wiring design.

Next, referring to FIGS. 6 and 7, FIG. 6 is an enlarged view of an area B of FIG. 3 and for the convenience of illustration, only a reference line RL, a reference branch line RBL, and a bank BNK are illustrated. Further, FIG. 7 is a cross-sectional view taken along VII-VII' of FIG. 6 and illustrates only components from the substrate 110 to the light emitting diode 160.

As described above, the third transistor 140 which is electrically connected to the reference line RL and the gate line GL includes a third gate electrode 141, a third source electrode 142, a third drain electrode 143, and a third active layer 144.

The reference line RL transmits a reference signal to each of the plurality of sub pixels SP and may be disposed between the white sub pixel SPW and the blue sub pixel SPB. In this case, in order to transmit the reference signal to each of the plurality of sub pixels SP, the reference line RL may be connected to the reference branch line RBL which extends in the row direction from the reference line RL. Here, the reference branch line RBL may be formed of the same material as the third active layer 144. The reference branch line RBL may include the second layer, that is, at least one of a semiconductor layer of at least one transistor and the auxiliary metal layer. The semiconductor layer may be formed of a semiconductor material such as an oxide semiconductor, amorphous silicon, or polysilicon, but is not limited thereto. The auxiliary metal layer may be configured by an opaque metal layer such as molytitanium (MoTi). The reference branch line RBL may be configured by conducting the semiconductor layer among the second layer in the emission area EA and may be configured to include both the semiconductor layer and the auxiliary metal layer of the second layer in the non-emission area NEA. It should be understood that "conducting" a semiconductor layer includes the meaning of "making conductive." For example, a portion of the semiconductor layer included in the reference branch line RBL may be or become a conductive portion. The conductive portion may be made conductive by adding dopants, applying a voltage or electrical field, or by other appropriate methods. As such, the reference branch line RBL may be said to be disposed in a conductive portion (i.e., a portion made conductive) of the semiconductor layer.

The reference line RL may be formed on the same layer as the plurality of high potential power line VDDL and the plurality of data lines DL on the substrate 110 and the reference branch line RBL may be disposed on the same layer as the first active layer 124, the second active layer 134, and the third active layer 144. The auxiliary reference line RLb may be used to connect the reference line RL and the reference branch line RBL. The auxiliary reference line RLb may be disposed on the same layer as the first gate electrode 121, the first source electrode 122, and the first drain electrode 123 and may be formed of the same material. The auxiliary reference line RLb may be connected to the reference line RL through the contact hole disposed on the reference line RL and may be connected to the reference branch line RBL, that is, the third active layer 144 through the plurality of second contact holes CH2.

However, the auxiliary reference line RLb may be designed with a cushion structure without having a bridge structure, by disposing the plurality of second contact holes CH2 connected to the reference branch line RBL next to the reference line RL, rather than a structure extending from the reference line RL in the row direction. That is, the reference branch line RBL is disposed to be adjacent to the reference line RL so that it is not necessary to extend the auxiliary reference line RLb in the row direction to form the plurality of second contact holes CH2. Accordingly, the auxiliary reference line RLb may include a plurality of second contact holes CH2 without having the bridge structure. Accordingly, all the plurality of second contact holes CH2 and the auxiliary reference line RLb which connect the reference branch line RBL and the auxiliary reference line RLb may overlap the bank BNK.

In the related art, the auxiliary reference line is designed to have a structure extending from the reference line in the row direction in the plan view. That is, the reference branch line is designed to be spaced apart from the reference line with an interval so that the auxiliary reference line extends from the reference line with a structure including a bridge to be connected with the reference branch line by forming a contact hole in a place overlapping the reference branch line. This is to treat the bridge area of the auxiliary reference line with the laser for the reference line repair process.

However, in the display device 100 according to the example embodiment of the present disclosure, the repair is performed via the plurality of second contact holes CH2, rather than the bridge area. Accordingly, the bridge structure of the auxiliary reference line RLb is deleted and the auxiliary reference line RLb is designed to have the cushion structure so that the plurality of second contact holes CH2 overlaps the bank BNK. That is, the auxiliary reference line RLb and the plurality of second contact holes CH2 may be blocked without protruding to the outside of the bank BNK. Accordingly, in the display device 100 of the present disclosure, the plurality of second contact holes CH2 and the auxiliary reference line RLb are designed to overlap the bank BNK to be disposed only in the non-emission area NEA, thereby improving the aperture ratio.

In the related art, in order to perform the repair process by processing the bridge area with the laser, a repair protection layer needs to be disposed thereabove to suppress the damage.

However, in the display device 100 according to the example embodiment of the present disclosure, the laser is not irradiated in the bridge area, but the reference line RL repair process is performed through the plurality of second contact holes CH2 so that the repair protection layer may not be disposed. That is, in the case of the hole repair which irradiates the laser to the plurality of second contact holes CH2 as in the display device 100 according to the example embodiment of the present disclosure, in order to perform the reference line RL repair process, the repair process is performed by irradiating a laser of a specific wavelength band which removes just to the reference branch line RBL, that is, the third active layer 144, to the plurality of second contact holes CH2. That is, it is not necessary to dispose the repair protection layer above the auxiliary reference line RLb and the plurality of second contact holes CH2 via the hole repair process. Accordingly, in the display device 100 according to the example embodiment of the present disclosure, an area in which the repair protection layer is disposed is spaced apart from the emission area EA so that the aperture ratio may be further improved.

Next, referring to FIGS. 8 and 9, FIG. 8 is an enlarged view of an area C of FIG. 3 and for the convenience of illustration, only a data line DL, a data branch line DBL, a connection electrode CE, and a bank BNK are illustrated. FIG. 9 is a cross-sectional view taken along IX-IX' of FIG. 8 and illustrates only components from the substrate 110 to the light emitting diode 160.

As described above, the second transistor 130 which is electrically connected to the data line DL and the gate line GL includes a second gate electrode 131, a second source electrode 132, a second drain electrode 133, and a second active layer 134.

The data line DL is a wiring line which transmits a data signal to each of the plurality of sub pixels SP. A first data line DL1 and a second data line DL2 may be disposed between the red sub pixel SPR and the white sub pixel SPW and a third data line DL3 and a fourth data line DL4 may be disposed between the blue sub pixel SPB and the green sub pixel SPG. In this case, in order to transmit the data signal to each of the plurality of sub pixels SP, the data line DL may be connected to the data branch line DBL which extends in the row direction from the data line DL. Here, the data branch line DBL may be formed of the same material as the second active layer 134. The data branch line DBL may include the second layer, that is at least one of a semiconductor layer of at least one transistor and the auxiliary metal layer. The semiconductor layer may be formed of a semiconductor material such as an oxide semiconductor, amorphous silicon, or polysilicon, but is not limited thereto. The auxiliary metal layer may be configured by an opaque metal layer material such as molytitanium (MoTi). The data branch line may be configured by conducting the semiconductor layer among the second layer in the emission area and may be configured to include both the semiconductor layer and the auxiliary metal layer of the second layer in the non-emission area.

The data line DL may be formed on the same layer as the plurality of high potential power line VDDL and the reference lines RL on the substrate 110 and the data branch line DBL may be disposed on the same layer as the first active layer 124, the second active layer 134, and the third active layer 144. The connection electrode CE may be used to connect the data line DL and the data branch line DBL. The connection electrode CE may be disposed on the same layer as the first gate electrode 121, the first source electrode 122, and the first drain electrode 123 and may be formed of the same material. That is, the connection electrode CE may be configured by the same layer as the first layer. The connection electrode CE may be connected to the data branch line DBL through the plurality of third contact holes CH3 and the connection electrode CE may be connected to the data line DL through a plurality of fourth contact holes CH4.

However, the connection electrode CE is connected to the data line DL through the plurality of fourth contact holes CH4, rather than extending from the data line DL in the row direction and is connected to the data branch line DBL through the plurality of third contact holes CH3 disposed next to the plurality of fourth contact holes CH4. Therefore, the connection electrode may be designed with a cushion structure without having a bridge structure. That is, the data branch line DBL is disposed to be adjacent to the data line DL so that it is not necessary to extend the connection electrode CE in the row direction to form the plurality of third contact holes CH3. Accordingly, the connection electrode CE may include a plurality of third contact holes CH3 without having the bridge structure. Accordingly, all the plurality of third contact holes CH3 configured to connect the data branch line DBL and the connection electrode CE and the plurality of fourth contact holes CH4 configured to connect the data line DL and the connection electrode CE may overlap the bank BNK.

In the related art, the connection electrode is designed to be disposed in a position extending from the data line in the row direction in the plan view. That is, the data branch line is designed to be spaced apart from the data line with an interval so that the connection electrode is connected in a place overlapping the data branch line, of the position extending from the data line with a structure including a bridge, through a contact hole. This is to treat the bridge area in which the data line extends in the row direction, with the laser for the data line repair process.

However, in the display device 100 according to the example embodiment of the present disclosure, the data line may be repaired via the plurality of third contact holes CH3, rather than the bridge area. Accordingly, the bridge structure extending in the row direction of the data line DL is deleted and the plurality of third contact holes CH3 and the plurality of fourth contact holes CH4 overlap the bank BNK by the cushion structure design of the connection electrode CE. That is, the connection electrode CE, the plurality of third contact holes CH3, and the plurality of fourth contact holes CH4 may be blocked without protruding to the outside area of the bank BNK. Accordingly, in the display device 100 of the present disclosure, the plurality of third contact holes CH3, the plurality of fourth contact holes CH4, and the connection electrode CE are designed to overlap the bank BNK to be disposed only in the non-emission area NEA, thereby improving the aperture ratio.

In the related art, in order to perform the repair process by processing the bridge area with the laser, a repair protection layer needs to be disposed thereabove to suppress the damage.

However, in the display device 100 according to the example embodiment of the present disclosure, the laser is not irradiated in the bridge area, but the data line DL repair process is performed through the plurality of third contact holes CH3 so that the repair protection layer may not be disposed. That is, in the case of the hole repair which irradiates the laser to the plurality of third contact holes CH3 as in the display device 100 according to the example embodiment of the present disclosure, in order to perform the data line (DL) repair process, the repair process may be performed by irradiating a laser of a specific wavelength band which removes only to the data branch line DBL, that is, the second active layer 134, to the plurality of third contact holes CH3. That is, it is not necessary to dispose the repair protection layer above the connection electrode CE, the plurality of third contact holes CH3, and the plurality of fourth contact holes CH4 by the hole repair process. As a result, the area in which the repair protection layer is disposed is far from the emission area EA so that the aperture ratio may be further improved.

The example embodiments of the present disclosure can also be described as follows:

In order to achieve the above-described objects, according to an aspect of the present disclosure, a display device includes a substrate in which an emission area and a non-emission area are included and having a plurality of sub pixels thereon; at least one gate line disposed in the non-emission area; at least one reference line disposed in the non-emission area and overlaps at least one gate line; and at least one data line disposed in the non-emission area and overlaps at least one gate line, in which the at least one gate line includes a first bridge line and a second bridge line branched at an area overlapping the at least one data line and the at least one reference line and the first bridge line and the second bridge line are disposed on different layers and are connected to each other through a plurality of first contact holes.

The first bridge line may be configured by a first layer and the second bridge line may be configured by a second layer disposed below the first layer.

At least one transistor may be disposed in the non-emission area, the first layer may be a metal layer which configures a gate electrode of the at least one transistor, and the second layer includes at least one of a semiconductor layer of the at least one transistor and an auxiliary metal layer.

The auxiliary metal layer may be configured by an opaque metal layer.

At least one reference branch line which may be connected to the at least one reference line to apply a reference voltage to the plurality of sub pixels.

The at least one reference branch line may be configured by the same layer as the second layer.

The at least one reference branch line and the at least one reference line may be connected via a plurality of second contact holes and the plurality of second contact holes overlaps a bank.

The at least one reference branch line disposed in the emission area may be configured by conducting the semiconductor layer of the second layer and the at least one reference branch line disposed in the non-emission area may be configured to include both the semiconductor layer and the auxiliary metal layer of the second layer.

The display device may further comprise at least one data branch line which may be connected to the at least one data line to apply a data voltage to the plurality of sub pixels.

The display device may further comprise at least one connection electrode configured to connect the at least one data line and the at least one data branch line.

The at least one data branch line may be configured by the same layer as the second layer and the at least one connection electrode may be configured by the same layer as the first layer.

The at least one data branch line and the at least one connection electrode may be connected via a plurality of third contact holes and the plurality of third contact holes overlaps a bank.

The at least one data line and the at least one connection electrode may be connected via a plurality of fourth contact holes and the plurality of fourth contact holes overlaps the bank.

The at least one data branch line disposed in the emission area may be configured by conducting the semiconductor layer of the second layer and the at least one data branch line disposed in the non-emission area may be configured to include both the semiconductor layer and the auxiliary metal layer of the second layer.

The repair method may comprise a first repair step of repairing the at least one gate line by irradiating a laser to any one of the plurality of bridge lines or the plurality of first contact holes.

The plurality of bridge lines may be configured by a first bridge line and a second bridge line branched at an area overlapping the at least one data line and the at least one reference line, the first bridge line may be configured by a first layer and the second bridge line may be configured by a second layer disposed below the first layer.

The first layer may be formed by a metal layer which configures a gate electrode of a transistor and the second layer may be formed by a semiconductor layer of the transistor and an auxiliary metal layer.

The display device may further include a repair protection layer only above the first bridge line and in the first repair step, the laser may be irradiated in an area where the repair protection layer and the first bridge line overlap.

The display device may further include at least one reference branch line which may be connected to the at least one reference line to apply a reference voltage to a plurality of sub pixels, a plurality of second contact holes configured to connect the at least one reference branch line and the at least one reference line; and a bank which overlaps the plurality of second contact holes, The repair method may further include a second repair step of repairing by irradiating a laser to the plurality of second contact holes.

The display device may further include at least one data branch line which may be connected to the at least one data line to apply a data voltage to a plurality of sub pixels, a connection electrode configured to connect the at least one data line and the at least one data branch line, a plurality of third contact holes configured to connect the data branch line and the connection electrode and a bank which overlaps the plurality of third contact holes.

The repair method may further include a third repair step of repairing by irradiating a laser to the plurality of third contact holes.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate in which an emission area and a non-emission area are included, and having a plurality of sub pixels thereon;
at least one gate line disposed in the non-emission area;
at least one reference line disposed in the non-emission area and overlapping the at least one gate line; and
at least one data line disposed in the non-emission area and overlapping the at least one gate line,
wherein the at least one gate line includes:
a first bridge line and a second bridge line branched at an area overlapping the at least one data line and the at least one reference line, the first bridge line and the second bridge line being disposed on different layers from each other, and being connected to each other via a plurality of first contact holes.

2. The display device according to claim 1, wherein the first bridge line includes a first layer, and the second bridge line includes a second layer disposed below the first layer.

3. The display device according to claim 2, wherein at least one transistor is disposed in the non-emission area, the first layer is a metal layer of a gate electrode of the at least one transistor, and the second layer includes at least one of a semiconductor layer of the at least one transistor and an auxiliary metal layer.

4. The display device according to claim 3, wherein the auxiliary metal layer is an opaque metal layer.

5. The display device according to claim 2, further comprising:
at least one reference branch line connected to the at least one reference line to apply a reference voltage to the plurality of sub pixels.

6. The display device according to claim 5, wherein the at least one reference branch line is disposed in the same layer as the second layer.

7. The display device according to claim 6, wherein the at least one reference branch line and the at least one reference line are connected to each other via a plurality of second contact holes, and the plurality of second contact holes overlaps a bank.

8. The display device according to claim 6, wherein the at least one reference branch line disposed in the emission area is a conductive portion of the semiconductor layer of the second layer, and the at least one reference branch line disposed in the non-emission area is configured to include both the semiconductor layer and the auxiliary metal layer of the second layer.

9. The display device according to claim 2, further comprising:
at least one data branch line connected to the at least one data line to apply a data voltage to the plurality of sub pixels.

10. The display device according to claim 9, further comprising:
at least one connection electrode configured to connect the at least one data line and the at least one data branch line to each other.

11. The display device according to claim 10, wherein the at least one data branch line is disposed in the same layer as the second layer, and the at least one connection electrode is disposed in the same layer as the first layer.

12. The display device according to claim 11, wherein the at least one data branch line and the at least one connection electrode are connected to each other via a plurality of third contact holes, and the plurality of third contact holes overlaps a bank.

13. The display device according to claim 12, wherein the at least one data line and the at least one connection electrode are connected to each other via a plurality of fourth contact holes, and the plurality of fourth contact holes overlaps the bank.

14. The display device according to claim 11, wherein the at least one data branch line disposed in the emission area is a conductive portion of the semiconductor layer of the second layer, and the at least one data branch line disposed in the non-emission area includes both the semiconductor layer and the auxiliary metal layer of the second layer.

* * * * *